United States Patent
Cheng et al.

(10) Patent No.: US 9,946,597 B2
(45) Date of Patent: Apr. 17, 2018

(54) PROTECTING EMBEDDED NONVOLATILE MEMORY FROM INTERFERENCE

(71) Applicant: FREESCALE SEMICONDUCTOR, INC., Austin, TX (US)

(72) Inventors: Zhihong Cheng, Suzhou (CN); Yin Guo, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/256,591

(22) Filed: Sep. 4, 2016

(65) Prior Publication Data

US 2017/0139772 A1 May 18, 2017

(30) Foreign Application Priority Data

Nov. 17, 2015 (CN) .......................... 2015 1 1035882

(51) Int. Cl.
| | |
|---|---|
| G06F 11/10 | (2006.01) |
| G06F 3/06 | (2006.01) |
| G11C 29/52 | (2006.01) |
| G11C 5/00 | (2006.01) |
| G11C 29/04 | (2006.01) |

(52) U.S. Cl.
CPC ........ *G06F 11/1068* (2013.01); *G06F 3/0619* (2013.01); *G06F 3/0659* (2013.01); *G06F 3/0679* (2013.01); *G11C 5/005* (2013.01); *G11C 29/52* (2013.01); *G11C 2029/0409* (2013.01); *G11C 2029/0411* (2013.01)

(58) Field of Classification Search
CPC .. G06F 11/1068; G06F 3/0619; G06F 3/0679; G06F 3/0659; G11C 5/005; G11C 29/52; G11C 2029/0411; G11C 2029/0409
See application file for complete search history.

(56) References Cited

U.S. PATENT DOCUMENTS

| | | | | |
|---|---|---|---|---|
| 4,433,416 | A * | 2/1984 | Kojima | G11B 20/1809 360/32 |
| 7,882,388 | B2 | 2/2011 | Bramante | |
| 8,392,794 | B2 | 3/2013 | Ou | |
| 8,547,724 | B2 | 10/2013 | Lee et al. | |
| 2008/0168320 | A1* | 7/2008 | Cassuto | G06F 11/1068 714/746 |

(Continued)

OTHER PUBLICATIONS

M. Beniakar, C. Sargentis, J. P. Xanthakis, A. Anastassopoulos, A. Kladas and D. Tsamakis, "A modeling of the retention characteristics of non-volatile memories embedded with metallic nanoparticles," 2009 International Semiconductor Device Research Symposium, College Park, MD, 2009, pp. 1-2.*

(Continued)

*Primary Examiner* — Cynthia Britt
(74) *Attorney, Agent, or Firm* — Charles E. Bergere (57) ABSTRACT

Electromagnetic compatibility (EMC) of a system-on-a-chip (SoC) is enhanced by encoding at least a subset of control signals before the control signals are transmitted over a bus (e.g., a bus internal to a SoC) from a controller to an embedded nonvolatile memory (NVM). The error-detection code used causes an EMC event to introduce errors into the transmitted codewords with relatively high probability. In response to an error being detected in the transmitted codeword, a set of safeguarding operations are performed to prevent the data stored in the NVM from being uncontrollably changed.

19 Claims, 5 Drawing Sheets

(56) References Cited

U.S. PATENT DOCUMENTS

| | | | | |
|---|---|---|---|---|
| 2010/0095186 | A1* | 4/2010 | Weingarten | G06F 11/1072 714/763 |
| 2014/0003156 | A1 | 1/2014 | He | |
| 2014/0182923 | A1 | 7/2014 | Gerken | |
| 2015/0046771 | A1* | 2/2015 | Kim | H03M 13/1128 714/764 |
| 2016/0313944 | A1* | 10/2016 | Hodgdon | G06F 3/061 |
| 2016/0378595 | A1* | 12/2016 | Rho | H03M 13/2909 714/764 |
| 2017/0109231 | A1* | 4/2017 | Cha | G06F 11/1068 |

OTHER PUBLICATIONS

B. Godard, J. M. Daga, L. Torres and G. Sassatelli, "Evaluation of Design for Reliability Techniques in Embedded Flash Memories," 2007 Design, Automation & Test in Europe Conference & Exhibition, Nice, 2007, pp. 1-6.*

W. Wen, M. Mao, X. Zhu, S. H. Kang, D. Wang and Y. Chen, "CD-ECC: Content-dependent error correction codes for combating asymmetric nonvolatile memory operation errors," 2013 IEEE/ACM International Conference on Computer-Aided Design (ICCAD), San Jose, CA, 2013, pp. 1-8.*

G. Jan et al., "Demonstration of fully functional 8Mb perpendicular STT-MRAM chips with sub-5ns writing for non-volatile embedded memories," 2014 Symposium on VLSI Technology (VLSI-Technology): Digest of Technical Papers, Honolulu, HI, 2014, pp. 1-2.*

. Ohsawa et al., "A 1.5nsec/2.1nsec random read/write cycle 1Mb STT-RAM using 6T2MTJ cell with background write for nonvolatile e-memories," 2013 Symposium on VLSI Circuits, Kyoto, 2013, pp. C110-C111.*

Q. Li, A. Jiang and E. F. Haratsch, "Noise modeling and capacity analysis for NAND flash memories," 2014 IEEE International Symposium on Information Theory, Honolulu, HI, 2014, pp. 2262-2266.*

D. h. Lee and W. Sung, "Least squares based cell-to-cell interference cancelation technique for multi-level cell nand flash memory," 2012 IEEE International Conference on Acoustics, Speech and Signal Processing (ICASSP), Kyoto, 2012, pp. 1601-1604.*

G. G Dong, S. Li and T. Zhang, "Using Data Postcompensation and Predistortion to Tolerate Cell-to-Cell Interference in MLC nand Flash Memory," in IEEE Transactions on Circuits and Systems I: Regular Papers, vol. 57, No. 10, pp. 2718-2728, Oct. 2010.*

M. Jeon, K. Kim, B. Shin and J. Lee, "Interference compensation technique for multilevel flash memory," 2011 IEEE 54th International Midwest Symposium on Circuits and Systems (MWSCAS), Seoul, 2011, pp. 1-4.*

H. N. Lin, C. W. Kuo, J. L. Chang and C. K. Chen, "Statistical analysis of EMI noise measurement for Flash Memory," 2011 8th Workshop on Electromagnetic Compatibility of Integrated Circuits, Dubrovnik, 2011, pp. 245-250.*

P. Poliakov et al., "Induced Variability of Cell-to-Cell Interference by Line Edge Roughness in nand Flash Arrays," in IEEE Electron Device Letters, vol. 33, No. 2, pp. 164-166, Feb. 2012.*

* cited by examiner

TABLE: CONTROL SIGNALS APPLIED TO THE eNVM 100

| SIGNAL LABEL | SIGNAL NAME AND BRIEF DESCRIPTION |
| --- | --- |
| XADDR | X ADDRESS. POINTS TO A WORD LINE WL AND THE CORRESPONDING ROW OF THE MEMORY CELLS 202 IN THE ARRAY 150. |
| YADDR | Y ADDRESS. POINTS TO A BIT LINE (OR A PLURALITY OF BIT LINES) BL AND THE CORRESPONDING COLUMN(S) OF THE MEMORY CELLS 202 IN THE ARRAY 150. |
| CLK | CLOCK. |
| DIN | DATA INPUT. |
| SE | SENSE AMPLIFIER ENABLE. "HIGH" TO ENABLE, AND "LOW" TO DISABLE. |
| XE | X - ADDRESS ENABLE. "HIGH" CAUSES THE SELECTED (BY XADDR) WORD LINE WL TO BECOME ACTIVE. "LOW" CAUSES ALL WORD LINES WL TO BE INACTIVE. |
| YE | Y - ADDRESS ENABLE. "HIGH" CAUSES THE SELECTED (BY YADDR) BIT LINE(S) BL TO BECOME ACTIVE. "LOW" CAUSES ALL BIT LINES BL TO BE INACTIVE. |
| ERASE | ERASE ENABLE. "HIGH" TO ENABLE THE ERASE MODE. "LOW" TO DISABLE THE ERASE MODE. |
| PROG | PROGRAM ENABLE. "HIGH" TO ENABLE THE PROGRAM MODE. "LOW" TO DISABLE THE PROGRAM MODE. |
| MAS | MASS ERASE ENABLE. "HIGH" TO ENABLE THE MASS ERASE MODE IN WHICH DATA IN ALL ROWS OF THE ARRAY 150 ARE ERASED. WHEN MAS IS "LOW" AND ERASE IS "HIGH", ONLY A SELECTED (BY XADDR) ROW OF THE ARRAY 150 IS ERASED. |
| NVSTR | HIGH VOLTAGE ATTACH. USED TO CONTROL THE APPLICATION OF HIGH VOLTAGE TO THE ARRAY 150 IN THE ERASE AND PROGRAM MODE. ALSO USED (IN COMBINATION WITH ERASE AND PROG) TO CONTROL THE CHARGE PUMP(S) IN THE GENERATOR 190 TO CAUSE IT TO GENERATE HIGH REQUIRED VOLTAGES FOR THE ERASE AND PROGRAM OPERATIONS. |
| CCE | CONTROL CLUSTER ENABLE. IF CCE IS "HIGH", THEN THE XE AND YE LOGIC LEVELS ARE REGISTERED IN THE RESPECTIVE REGISTERS 102. IF CCE IS "LOW", THEN THE REGISTERED LOGIC LEVELS OF XE AND YE REMAIN UNCHANGED. |
| PCE | PROGRAM CONTROL CLUSTER ENABLE. IF PCE IS "HIGH", THEN ERASE, PROG, MAS, AND NVSTR ARE REGISTERED IN THE RESPECTIVE REGISTERS 102. IF PCE IS "LOW", THEN THE REGISTERED LOGIC LEVELS OF ERASE, PROG, MAS, AND NVSTR REMAIN UNCHANGED. |

TABLE: EXAMPLE CODE FOR THE IC 400

| BIT LABEL | INPUT/OUTPUT DATA WORD | | | CODEWORD | | | | |
|---|---|---|---|---|---|---|---|---|
| | B0 | B1 | B2 | C0 | C1 | C2 | C3 | C4 |
| WORD 1 | 1 | 0 | 1 | 0 | 0 | 1 | 1 | 0 |
| WORD 2 | 1 | 1 | 0 | 0 | 1 | 0 | 1 | 0 |
| WORD 3 | 0 | 0 | 0 | 1 | 0 | 0 | 0 | 1 |

FIG. 5

PROTECTING EMBEDDED NONVOLATILE MEMORY FROM INTERFERENCE

BACKGROUND

The present invention relates embedded nonvolatile memory (eNVM) and, more particularly, to protecting data stored in eNVM from corruption due to an electromagnetic-compatibility (EMC) event, such as electromagnetic interference (EMI), electrostatic discharge (ESD), and the like.

The term "electromagnetic compatibility" (EMC) refers to the ability of electrical equipment in general and electrical circuits in particular not to behave unacceptably when subjected to various types of interference, including EMI, ESD, and other electromagnetic disturbances. For example, certain EMC measures can be taken to address susceptibility and/or immunity issues in an integrated circuit (IC), with the general purpose being protection of the IC from disruption and/or breakdown due to an EMC event. Example EMC measures may include customized control of operating regimes, circuit-design constraints and/or features, EMC testing, EMI shielding, etc.

Embedded nonvolatile memory (eNVM) is an important IC component that adds flexibility to electronic products and helps to shorten time to market. For example, eNVMs are widely used in a variety of microcontroller applications in automotive, mobility, and security markets due to the eNVM's ability to support relatively high system speed via fast code access, in-system and/or on-board re-programmability of code and data storage, relatively low power consumption, and real-time controllability of the IC functions. However, a known problem with some eNVM designs is that a moderately strong EMC event may be capable of toggling certain critical eNVM control signals in a manner that causes the data or program stored in the eNVM to be uncontrollably changed, e.g., erased or randomly reprogrammed. In most cases, such uncontrollable changes precipitate a complete breakdown in the operation of the corresponding system-on-a-chip (SoC). In some systems, such as a moving vehicle, such a breakdown can be extremely dangerous, as it can compromise the safety of the occupants.

BRIEF DESCRIPTION OF THE DRAWINGS

Embodiments of the present invention(s) are illustrated herein by way of example and are not limited by the accompanying figures, in which like references indicate similar elements. Elements in the figures are illustrated for simplicity and clarity and have not necessarily been drawn to scale. Various aspects, features, and benefits of the disclosed embodiments will become more fully apparent, by way of example, from the following detailed description that refers to the accompanying figures, in which.

DETAILED DESCRIPTION

Detailed illustrative embodiments of the present invention are disclosed herein. However, specific structural and functional details to which the disclosure refers are merely representative for purposes of describing example embodiments of the present invention. Embodiments of the present invention may be embodied in many alternative forms and should not be construed as limited to only the embodiments set forth herein.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative embodiments, certain functions or acts may occur out of the order indicated in the figures.

As used herein, the terms "assert" and "de-assert" are used when referring to the rendering of a control signal, status bit, or other relevant functional feature or element into its logically true and logically false state, respectively. If the logically true state is a logic level one, then the logically false state is a logic level zero. Alternatively, if the logically true state is logic level zero, then the logically false state is logic level one.

In various alternative embodiments, each logic signal described herein may be generated using positive or negative logic circuitry. For example, in the case of a negative logic signal, the signal is active low, and the logically true state corresponds to a logic level zero. Alternatively, in the case of a positive logic signal, the signal is active high, and the logically true state corresponds to a logic level one.

According to the present invention, eNVM vulnerabilities are addressed by encoding at least a subset of control signals prior to the control-signal transmission over an internal bus of an IC or SoC within which the eNVM is located, from a controller to the eNVM. In one embodiment, the error-detection code used for this purpose is specifically designed to cause any EMC event to introduce errors into the transmitted codewords with relatively high probability. In response to an error being detected in the transmitted codeword, the SoC executes an appropriate set of safeguarding operations that prevent the data or program stored in the eNVM from being uncontrollably changed.

In one embodiment, the present invention provides an IC including an eNVM having an array of memory cells and a plurality of control registers. A controller is configured to generate control signals for the NVM. An encoder is configured to receive at least a subset of the control signals from the controller and convert a first set of logic values provided by the subset of the control signals into a corresponding codeword, the conversion being performed using an error-detection code. A decoder is configured to: (i) receive a codeword from the encoder and apply the error-detection code to detect any errors in the codeword, as received by the decoder; and (ii) in response to an error being detected in the codeword, prevent a memory operation not corresponding to the first set of logic values from being performed on data stored in the array of memory cells.

In another embodiment, the present invention provides a method of enhancing EMC of an IC. The method includes converting a first set of logic values provided by at least a subset of control signals into a corresponding codeword, the conversion being performed using an error-detection code. The IC comprises an embedded NVM having an array of memory cells and a plurality of control registers, and a controller configured to (i) generate the control signals for the NVM, (ii) transmit the codeword on a bus; (iii) apply the error-detection code to detect any errors in the codeword after the codeword has been transmitted on the bus; and (iv) in response to an error being detected in the codeword after the transmission, prevent a memory operation not corresponding to the first set of logic values from being performed on data stored in the array of memory cells.

Figure 1:
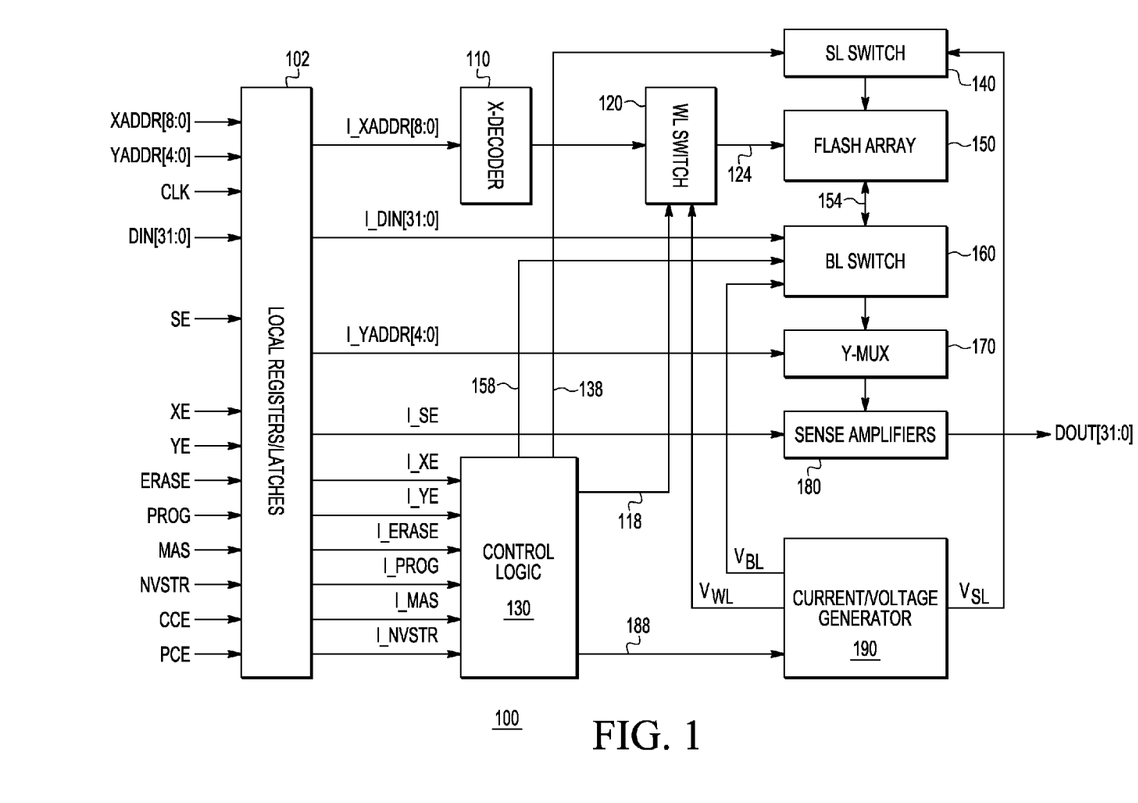
FIG. 1 is a schematic block diagram that illustrates an eNVM according to an embodiment of the invention.

Referring not to FIG. 1, a block diagram of an eNVM 100 according to an embodiment of the invention is shown. The eNVM 100 includes an array 150 of flash memory cells that can be accessed as further explained below. For illustration purposes, further description of the eNVM 100 is given in reference to an embodiment in which the array 150 comprises a plurality of split-gate flash memory cells 202 arranged in a NOR configuration, as further illustrated in FIG. 2. A person of ordinary skill in the art will appreciate that embodiments of the invention(s) disclosed herein are nevertheless not so limited. For example, inventive concepts may similarly be applied to NAND flash memories and/or other (not necessarily split-gate) flash memory cell structures.

Figure 2:
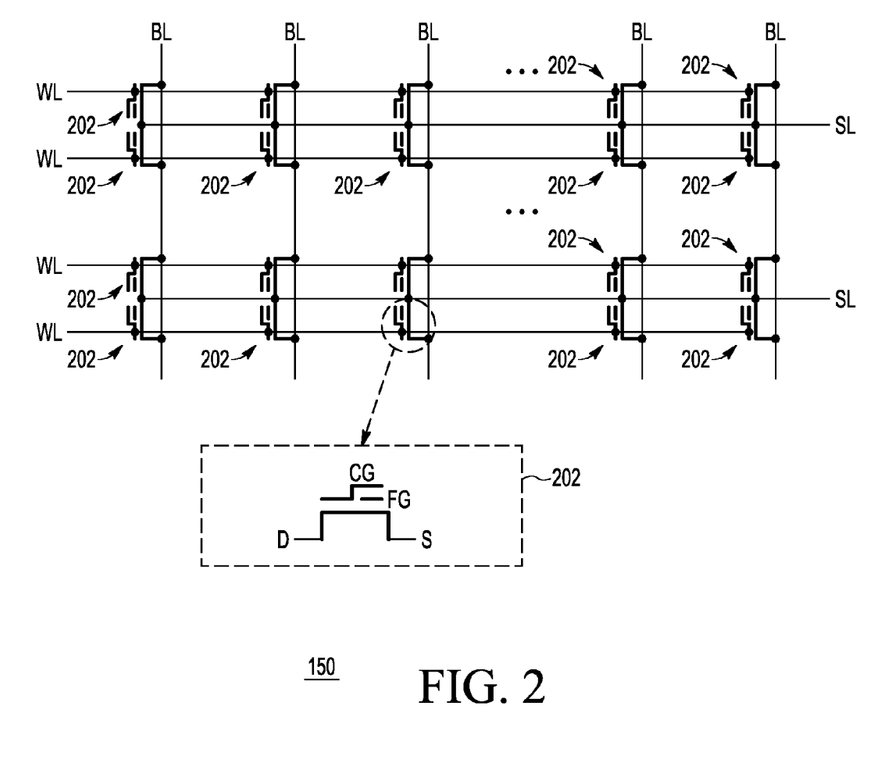
FIG. 2 is a schematic circuit diagram that illustrates an array of flash memory cells that can be used in the eNVM of FIG. 1 according to an embodiment of the invention.

FIG. 2 is a circuit diagram that illustrates the array 150 (FIG. 1) according to an embodiment of the invention. The split-gate flash memory cells 202 in the array 150 are electrically interconnected as indicated in FIG. 2. The inset in FIG. 2 shows an enlarged diagram of a split-gate flash memory cell 202.

In an example embodiment, a memory cell 202 is substantially a field-effect transistor (FET) having the following structural elements: (i) a source S; (ii) a drain D; (iii) a floating gate FG; and (iv) a control gate CG. The source S of a memory cell 202 is electrically connected to a respective source line SL of the array 150 as indicated in FIG. 2. The drain D of a memory cell 202 is electrically connected to a respective bit line BL of the array 150 as further indicated in FIG. 2. The control gate CG of a memory cell 202 is electrically connected to a respective word line WL of the array 150 as further indicated in FIG. 2.

The electrically neutral (or positively charged) state of the floating gate FG in a memory cell 202 is associated with the logic state "one," and the negatively charged state of the floating gate FG is associated with the logic state "zero." The datum stored in a memory cell 202 can be determined, e.g., by measuring the threshold voltage of the cell's FET. In practice, the logic state of a memory cell 202 is determined by sensing the electrical current flowing through that memory cell at a specific fixed bias voltage applied to the control gate CG. With the appropriately selected bias voltage, a relatively large current will flow through the memory cell 202 when the floating gate FG is electrically neutral (or positively charged), and a significantly lower current (e.g., substantially no current) will flow therethrough when the floating gate FG is negatively charged. By using an appropriate current threshold, the sense amplifier can be configured to reliably determine whether the read datum is a "one" or a "zero".

In an example configuration, the following voltages can be used to read the logic state of a memory cell 202: $V_{SL}=0$ V; $V_{BL}=\sim 1$ V; and $V_{WL}=\sim 2.5$ V. Herein, $V_{SL}$ denotes the voltage applied to the source S in the memory cell 202 via the respective source line SL. $V_{BL}$ denotes the voltage applied to the drain D in the memory cell 202 via the respective bit line BL. $V_{WL}$ denotes the voltage applied to the control gate CG in the memory cell 202 via the respective word line WL.

A memory cell 202 can be programmed using hot-carrier injection (HCI) into the floating gate FG at the drain side thereof. In an example configuration, the following voltages can be used in the array 150 for this purpose: $V_{SL}=\sim 10$ V; $V_{BL}=\sim 0.6$ V; and $V_{WL}=\sim 2$ V.

A memory cell 202 can be erased (i.e., put into the default logic level "one" state) using Fowler-Nordheim electron tunneling from the floating gate FG, through the tunnel oxide, into the control gate CG. In an example configuration, the following voltages can be used in the array 150 for this purpose: $V_{SL}=0$ V; $V_{BL}=0$ V; and $V_{WL}=\sim 13$ V.

Referring back to FIG. 1, the eNVM 100 comprises a current/voltage generator 190 that generates, inter alia, the above-mentioned voltages $V_{SL}$, $V_{BL}$, and $V_{WL}$ for further application to the array 150. A control logic subunit 130 controls the operation of the current/voltage generator 190 using a corresponding control signal 188. In an example embodiment, the current/voltage generator 190 includes one or more of a charge pump, a voltage converter, and a current source (not explicitly shown in FIG. 1).

Figure 3:
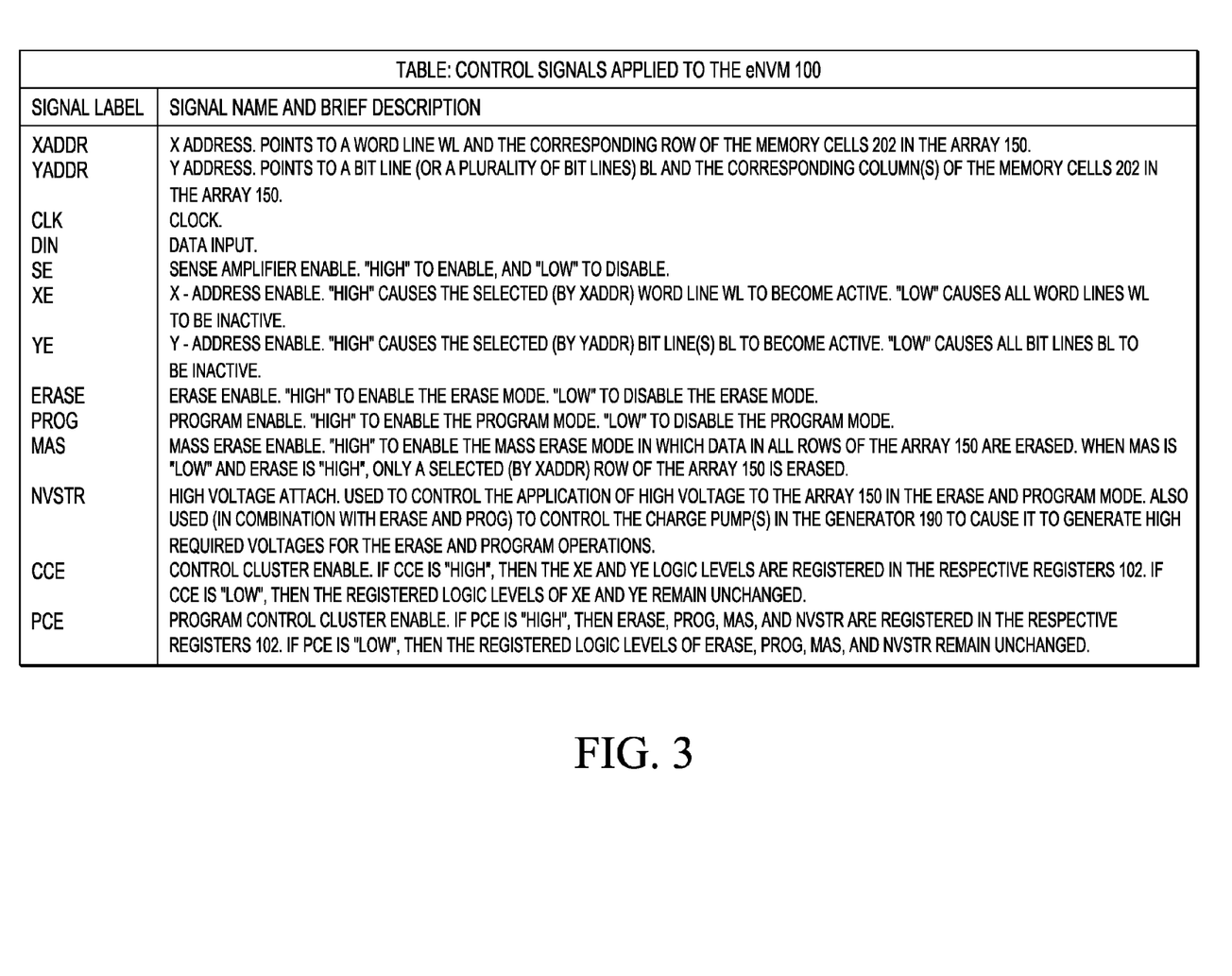
FIG. 3 shows a table that lists example control signals applied to the eNVM of FIG. 1 according to an embodiment of the invention.

The eNVM 100 further comprises a plurality of control registers (e.g., latches) 102 configured to receive and store the logic levels of the various indicated control signals that can be used to control the operation of the eNVM 100 (also see FIG. 3). In an example embodiment, these control signals can be applied to the registers 102 by a controller of the corresponding SoC via a relatively long bus (not explicitly shown in FIG. 2; see FIG. 4) that is external to the eNVM 100 but internal to the SoC. The registers 102 are in turn configured to apply the logic levels stored therein to the various internal subunits of the eNVM 100, e.g., as indicated in FIG. 1. In contrast to the external bus that delivers the externally generated control signals to the registers 102, the signal lines that distribute the corresponding local control signals to the subunits of the eNVM 100 are internal to the eNVM 100 and, as such, are relatively short in length.

FIG. 3 shows a table that lists example external control signals received by the registers 102 according to an embodiment of the invention. The first column in the table shows the label of each control signal (also see FIG. 1), and the second column in the table provides the signal name and brief functional description. As already indicated above, the registered logic levels of the external control signals are applied by the registers 102 to the various subunits of the eNVM 100, e.g., as indicated in FIG. 1. The resulting internal control signals are labeled in FIG. 1 using the labels that are derived from the labels of the corresponding external control signals by appending thereto the prefix "I_", which stands for internal.

Referring back to FIG. 1, some of the external and internal control signals used in the eNVM 100 are multi-bit signals, and the respective signal-word lengths are indicated in FIG. 1 by the numbers in square brackets. For example, the signal-word length for the control signals XADDR and I_XADDR is nine bits, which is indicated by the [8:0] appended to the signal labels. Similarly, the signal-word length for the control signals YADDR and I_YADDR is five bits, which is indicated by the [4:0] appended to the signal labels. The word length for the data input signals DIN and I_DIN is 32 bits, which is indicated by the [31:0] appended to the signal labels. The word length for the data output signal DOUT is 32 bits, which is similarly indicated by the [31:0] appended to the signal labels.

In operation, an X-decoder 110 determines, based on the control signal I_XADDR, the row number of the memory cells 202 that need to be accessed and then causes a WL switch 120 to activate the corresponding word line WL (also see FIG. 2) of a WL bus 124. The activated word line WL can then apply the voltage $V_{WL}$ to all memory cells 202 in the selected row. A Y-multiplexer (Y-MUX) 170 uses the control signal I_YADDR to similarly select the corresponding column(s) of the memory cells 202 and connect the corresponding bit line(s) BL (also see FIG. 2) to a bank of sense amplifiers 180. This enables (i) the sense amplifiers 180 to measure currents in order to sense the logic levels on the corresponding bit lines BL of a BL bus 154 during a read operation or (ii) a BL switch 160 to apply the voltage $V_{BL}$ to the corresponding bit lines BL of the BL bus 154 during a program or erase operation.

The current/voltage generator 190 operates to generate the appropriate (for each memory operation) voltages $V_{WL}$ and $V_{BL}$ and supply them to the WL switch 120 and the BL switch 160, respectively, for further application to the word/bit lines WL/BL of the selected rows and columns of the memory cells 202 in the array 150. The current/voltage generator 190 further operates to generate the appropriate (for each memory operation) voltage $V_{SL}$ and supply it to an SL switch 140 for further application to the source lines SL (also see FIG. 2) in the array 150. The configurations of the WL switch 120, SL switch 140, and BL switch 160 are controlled by the control logic subunit 130 via control signals 118, 138, and 158, respectively. The control logic subunit 130 generates the control signals 118, 138, and 158, and also the aforementioned control signal 188 based on the internal control signals I_XE, I_YE, I_ERASE, I_PROG, I_MAS, and I_NVSTR received from the corresponding control registers 102.

A relatively strong EMC event is generally capable of changing the logic levels stored in the registers 102 via at least two different theoretically postulated mechanisms. First, the relatively long external bus lines that connect the registers 102 to the controller can pick up interference during an EMC event and convert the picked-up interference into relatively strong electrical signals on at least some of the bus lines, which can then uncontrollably overwrite the content of the corresponding registers 102. Second, an EMC event can sometimes cause a power-supply voltage VDD or VSS, or both, to become non-uniform throughout the SoC, which means that some portions of the SoC receive a higher power-supply voltage than some other portions. For instance, if the VSS voltage at the electronic-controller portion of the SoC is relatively high (e.g., about 1.8 V higher than the VSS voltage at the eNVM portion, with 1.8 V being the logic "one" voltage level), then the control signals carrying logic "zeros" from the controller portion of the SoC can be erroneously captured as logic "ones" by the corresponding registers 102. Both of these theoretically postulated mechanisms are capable of altering the data in the registers 102 in a manner that causes an erase operation or a program operation to be activated and performed by the eNVM 100. Furthermore, in some situations, several consecutive EMC events can produce a cumulative effect that triggers an unintended memory operation, while any single of these EMC events is too weak to do so. For example, one EMC event might only change a few bits in the registers 102, which may not immediately trigger an unintended memory operation. However, subsequent EMC events might change additional bits in the registers 102 such that the cumulative changes cause an unintended memory operation to occur.

For example, an erase operation in the eNVM 100 can be activated when the stored logic levels corresponding to the control signals ERASE, NVSTR, XE, etc., are all accidentally set to "high." Similarly, a program operation in the eNVM 100 can be activated when the control signals PROG, NVSTR, XE, etc., are all accidentally set to "high." Unfortunately, there are documented instances of EMC events that triggered an erase or program operation in the eNVM 100 in this manner, which then rendered the corresponding SoC inoperable.

At least some of the above-indicated problems can be addressed using an inventive EMC interface placed in the corresponding SoC between the eNVM 100 and the controller. This EMC interface is specifically designed and configured to significantly reduce the susceptibility to EMC events of any SoC having an eNVM 100. Example embodiments of the EMC interface are described in more detail below in reference to FIGS. 4-5.

Figure 4:
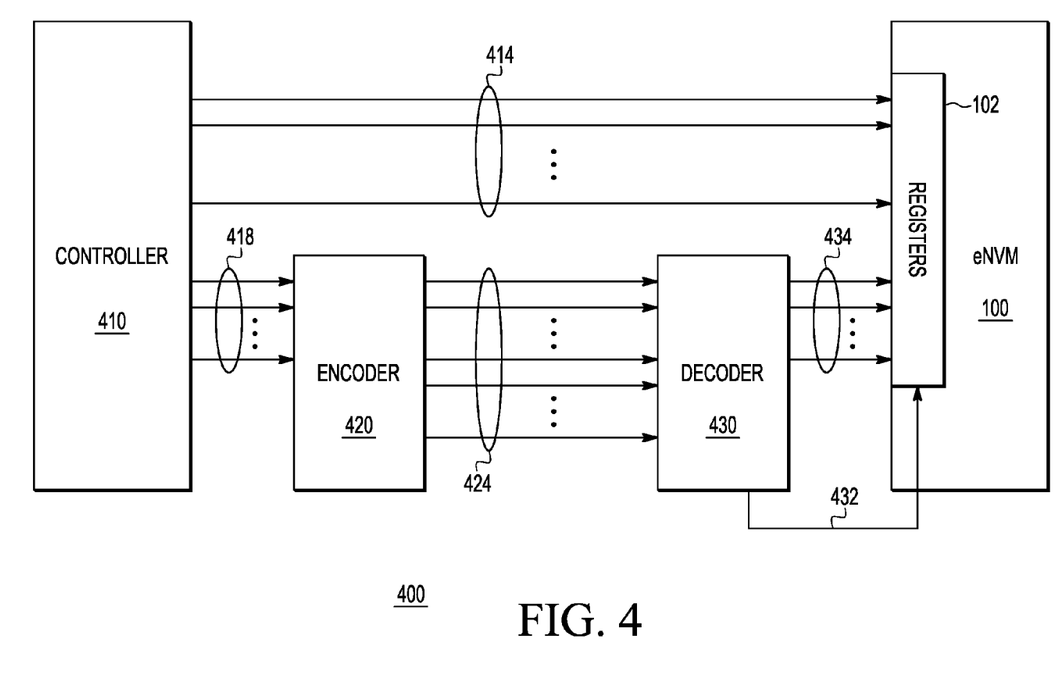
FIG. 4 is a schematic block diagram that illustrates an IC that includes the eNVM of FIG. 1 according to an embodiment of the invention.

FIG. 4 is a block diagram that illustrates an IC 400 that includes the eNVM 100 (FIG. 1) according to an embodiment of the invention. The IC 400 further includes a controller 410, an encoder 420, and a decoder 430. The encoder 420 and the decoder 430 provide an embodiment of the above-mentioned EMC interface located between the controller 410 and the eNVM 100. In an example embodiment, the IC 400 implements or is part of an SoC.

In operation, the controller 410 generates a plurality of control signals for the eNVM 100, such as the control signals shown in FIG. 3. The controller 410 then applies a first subset of the generated control signals to a bus 414, with each control-signal bit being applied to a respective one of the bus lines in the bus 414. The controller 410 similarly applies a second subset of the generated control signals to a bus 418. A person of ordinary skill in the art will understand that busses 414 and 418 may be configured to carry multi-bit control signals using a corresponding number (>1) of bus lines.

In an example embodiment, the second subset of the control signals includes the following control signals: ERASE, PROG, XE, YE, CCE, and PCE. Other signal selections for the second subset are also possible in alternative embodiments. In some embodiments, all control signals listed in the table of FIG. 3 can belong to the second subset. In some embodiments, the first subset is empty, i.e., does not have any control signals at all.

The bus lines in the bus 414 are relatively long in length and are configured to carry and apply the control signals of the first subset directly to the corresponding registers 102 in the eNVM 100. In contrast, the bus lines in the bus 418 are relatively short and are configured to carry and apply the control signals of the second subset to the encoder 420 located on the chip in relatively close proximity to the controller 410. In an example embodiment, the second subset of control signals has two or more control signals generated by the controller 410, all to be carried by the bus 418. The aforementioned first subset of control signals includes the remaining control signals generated by the controller 410 for the eNVM 100.

The encoder 420 is configured to treat the logic values received on the bus 418 as an input data word to be converted into a corresponding codeword. The encoder 420 generates the codeword from the input data word using a suitable error-detection code and then applies the resulting codeword to a bus 424, with each codeword bit being applied to a respective one of the bus lines in the bus 424.

In some embodiments, the error-detection code causes the codeword to be of the same length as the input data word. In some other embodiments, the error-detection code causes the codeword to be of a greater length than the input data word (see, e.g., FIG. 5).

In a possible embodiment, a suitable error-detection code, in which input data words and the corresponding codewords are of the same length, may have the following features. The code is designed to cause the encoded control signals corresponding to an erase or program operation not to be at the same logic level on the bus 424 at the same time. For example, for an erase operation to occur, the control signals ERASE, PROG, and XE need to be at the logic "one," "zero," and "one," respectively. The code however can be configured to cause the corresponding 3-bit codeword to carry in the corresponding positions the logic "one," "zero," and "zero," respectively. Similarly, for a program operation to occur, the control signals ERASE, PROG, and XE need to be at the logic "zero," "one," and "one," respectively. The code however can be configured to cause the corresponding 3-bit codeword to carry in the corresponding positions the logic "zero," "one," and "zero," respectively. In case of an EMC event, either of the above-described 3-bit codewords is likely to be changed such that an introduced error will be detectable with relatively high probability and in a relatively straightforward manner by the decoder 430 due to the nature of EMI/ESD and its supposed mechanisms of action.

The bus 424 is configured to connect the encoder 420 and the decoder 430, which is located on the chip in relatively close proximity to the eNVM 100. As a result of this placement of the decoder 430, the bus lines in the bus 424 are similar in length to the bus lines in the bus 414, and the bus lines in a bus 434 are similar in length to the bus lines in the bus 418. A person of ordinary skill in the art will appreciate that, due to the large difference in the bus length between the busses 414/424 and the busses 418/434, the signals on the busses 414/424 are much more likely to be adversely impacted by an EMC event than the signals on the busses 418/434.

The decoder 430 is configured to receive, on the bus 424, the codeword generated by the encoder 420 and apply the same error-detection code as the encoder 420 to recover the original input data word that was received by the encoder 420 on the bus 418. The decoder 430 then operates to output the recovered data word on the bus 434 such that the bus lines apply the logic values of the corresponding control signals to the appropriate control registers 102 of the eNVM 100. Additional example error-detection codes that can be used in the encoder 420 and the decoder 430 to carry out the above-described encoding/decoding operations are described in more detail further below, e.g., in reference to FIG. 5.

If the decoder 430 determines that the codeword received on the bus 424 is not a valid codeword of the operative error-detection code (e.g., has an error in it), then the decoder 430 operates to take appropriate actions to protect the data stored in the eNVM 100 from accidental alteration. For example, in some embodiments, if the decoder 430 determines that the codeword received on the bus 424 is not a valid codeword of the operative error-detection code, then the decoder 430 operates to output on the bus 434 the controls signal values corresponding to a safe state (e.g., corresponding to no memory operation). As a result, no erase or program operation can be accidentally activated.

Alternatively or in addition, the decoder 430 can assert a reset control signal 432 applied to the registers 102 in some embodiments. This assertion of the reset control signal 432 then causes the eNVM 100 to reset the contents of all the registers 102, e.g., to a predetermined safe state defined such that it temporarily prevents any operations on the data stored in the array 150 (FIG. 1) from being carried out. This feature may be helpful to reduce the probability for multiple EMC events to cumulatively trigger an unintended memory operation, e.g., as speculated above. The register reset via the reset control signal 432 safeguards against adverse cumulative effects by forcing the registers 102 to safe-state the eNVM 100 each time an error is detected after a single EMC event. Hence, these resets of the registers 102 enhance the above-described EMC protection for the data or program stored in the eNVM 100.

As already explained above, corruption of control signals carried on relatively long bus lines, such as those in the busses 424 and 414, can be caused by a moderately strong EMC event. The error detection, safe-stating the control registers 102, and the control-register reset via the reset control signal 432 implemented in the IC 400, e.g. as described above, can advantageously protect the data stored in the array 150 from accidental uncontrollable alteration that might be triggered by one or more such EMC events.

In yet another example embodiment, the second subset of control signals (which is applied by the controller 410 to the bus 418) includes the control signals ERASE, PROG, and XE (also see FIG. 3). The corresponding input data word applied to the encoder 420 by the bus 418 is thus 3-bit long. Based on the received 3-bit input data word, the encoder 420 may generate a codeword that is 3-bit long or 5-bit long, e.g., as described above. The encoder 420 then applies the generated codeword to the bus 424. The decoder 430 decodes the codeword received on the bus 424 to recover the original input data word applied by the controller 410 to the bus 418. The decoder 430 then applies the recovered data word to the bus 434 for further application to the appropriate control registers 102 in the eNVM 100. If the decoder 430 detects an error in the codeword received on the bus 424, then the decoder 430 takes one or more of the above-described safety actions, such as asserting the reset control signal 432 to safe-state the logic values stored in the registers 102.

Figure 5:
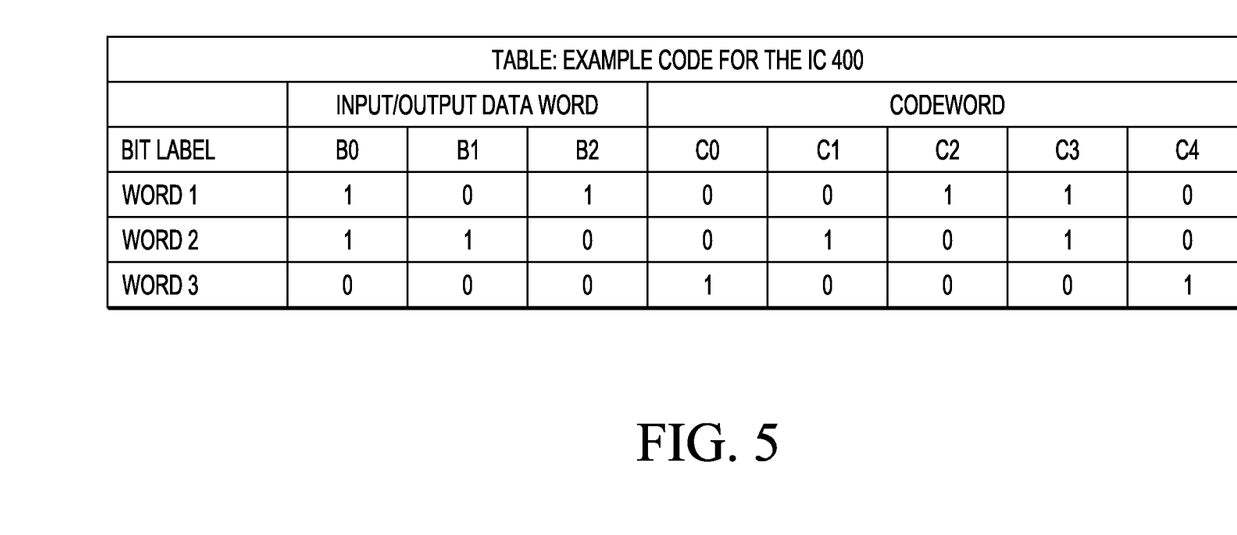
FIG. 5 shows a table that illustrates an error-detection code that can be used in the IC of FIG. 4 according to an embodiment of the invention.

FIG. 5 shows a table that illustrates an error-detection code that can be used in the encoder 420 and the decoder 430 (FIG. 4) according to an embodiment of the invention. During an encoding operation performed by the encoder 420, this error-detection code can be used to convert a 3-bit input data word into a corresponding 3-bit or 5-bit codeword. During a decoding operation performed by the decoder 430, this error-detection code is used to convert a 3-bit or 5-bit codeword into a corresponding 3-bit output data word and also detect possible errors in the 5-bit codeword.

In an example embodiment corresponding to 5-bit codewords, the input/output data-word bits b0, b1, and b2 can be assigned to carry the logic values of the control signals XE, ERASE, and PROG, respectively. Under this assignment, the data words "Word 1" and "Word 2" shown in FIG. 5 correspond to the program and erase memory operations, respectively, in the eNVM 100 (also see FIG. 3). The data word "Word 3" shown in FIG. 5 corresponds to the majority of other memory operations in the eNVM 100.

The error-detection code illustrated in FIG. 5 can use the following example encoding/decoding rules to interconvert the 3-bit input/output data word (b0,b1,b2) and the 5-bit codeword (c0,c1,c2,c3,c4). Rule 1: c0 is always different from c1 or c2, or both c1 and c2. Rule 2: b1=c1. Rule 3: b2=c2. Rule 4: c3 is always different from c4. These example encoding/decoding rules are constructed based on an experimental observation that an EMC event, such as EMI/ESD, tend to toggle a subset of proximate control signals or sometimes all control signals in the same direction, e.g., all to high or all to low. However, this type of control-signal toggling is very likely to introduce errors into the 5-bit codewords generated using the above-indicated encoding/decoding rules and, as such, enable detection of an EMC event with relatively high probability, e.g., as further detailed below.

The decoder 430 is configured to check the 5-bit codeword received on the bus 424 for compliance with Rule 1 and Rule 4. If the received codeword complies with these two rules, then the decoder 430 concludes that the received codeword is a valid codeword (i.e., there is no error in it) and proceeds to reconstruct the data word (b0,b1,b2) using the full set of rules. If the received codeword violates at least one of Rules 1 and 4, then the decoder 430 concludes that the received codeword has been corrupted (i.e., has an error in it) and, for example, proceeds to (i) output all zeros on the bus 434 and/or (ii) assert the reset control signal 432.

In some embodiments, the codeword can be only 3-bit long and be of the following format: (c0,c1,c2).

To further improve the robustness of the error-detection scheme(s) illustrated by FIGS. 4 and 5, the following additional features can optionally be implemented in the IC 400. The bus lines configured to carry the codeword bits c0, c1, and c2 can be placed directly adjacent to one another and be geometrically parallel to one another in the bus 424. For example, in one possible embodiment, the bus 424 does not have any other lines located between the bus lines carrying the bits c0 and c1, and also between the bus lines carrying the bits c1 and c2. Alternatively or in addition, the bus lines configured to carry the codeword bits c3 and c4 can be placed directly adjacent to one another and be geometrically parallel to one another in the bus 424.

These additional features improve the robustness of the above-described error-detection scheme because an EMC event tends to electrically bias the immediately adjacent bus lines in the same direction. Thus, in case of an EMC event, the adjacent bus lines configured to carry the codeword bits c0, c1, and c2 are likely to be all biased to the same logic state, e.g., either low or high. However, the codewords (0,0,0,x,x) and (1,1,1,x,x) violate Rule 1 and, as such, will be identified as invalid by the decoder 430. Similarly, the adjacent bus lines configured to carry the codeword bits c3 and c4 are also likely to be both biased by an EMC event to low or to high. However, the codewords (x,x,x,0,0) and (x,x,x,1,1) violate Rule 4 and, as such, will also be identified as invalid by the decoder 430.

Based on the described example embodiments, a person of ordinary skill in the art will be able to make and use various additional embodiments based on the disclosed inventive concepts. For example, the controller 410 may be configured to apply to the bus 418 a subset of control signals that is different from the subset consisting of the control signals XE, ERASE, and PROG. The number of control signals included in this subset may be different from three. The number of parity bits in the codeword carried on the bus 424 may be different from two. The encoder 420 and the decoder 430 can be programmed to use an error-detection code that is different from the error-detection code(s) illustrated in FIG. 5. In some embodiments, the used error-detection code may also enable error correction. In such embodiments, the decoder 430 can be configured to perform error correction to recover the original input data word and further configured to assert the reset control signal 432 only in some cases, e.g., when the errors in the received codeword render the corresponding original data word unrecoverable.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. An integrated circuit that protects data stored in a memory of the integrated circuit from corruption due to an EMC event, the integrated circuit comprising:
   an embedded nonvolatile memory (NVM) having an array of memory cells and a plurality of control registers;
   a controller that generates a plurality of control signals for the NVM;
   an encoder that receives at least a subset of the control signals from the controller and converts a first set of logic values provided by the subset of the control signals to a corresponding codeword, wherein the conversion is performed using an error-detection code;
   a first bus coupled between the encoder and the decoder, wherein the first bus applies the codeword to the decoder by carrying each bit of the codeword on a respective dedicated bus line of the first bus; and
   a decoder that (i) receives a codeword from the encoder by way of the first bus and applies the error-detection code to detect any errors in the codeword, as received by the decoder, and (ii) in response to detecting an error in the codeword, prevents a memory operation not corresponding to the first set of logic values from being performed on data stored in the array of memory cells, thereby protecting the data stored in the array of memory cells.

2. The integrated circuit of claim 1, wherein the memory operation is at least one of a program operation and an erase operation.

3. The integrated circuit of claim 1, wherein, in response to detecting the error by the decoder, the controller causes a reset of logic values stored in at least some of the control registers.

4. The integrated circuit of claim 3, wherein the reset causes the logic values stored in the control registers to be reset to a predetermined safe state that prevents the memory operation.

5. The integrated circuit of claim 1, wherein, in response to detection of an error in the codeword, the decoder causes a subset of the control registers corresponding to the subset of the control signals to receive a second set of logic values that prevents a memory operation not corresponding to the first set of logic values from being performed on data stored in the array of memory cells.

6. The integrated circuit of claim 5, wherein the second set of logic values is all zeros.

7. The integrated circuit of claim 5, wherein, in response to detection of the error, the decoder performs error correction to cause the second set of logic values to be identical to the first set of logic values.

8. The integrated circuit of claim 1, wherein at least two of the respective dedicated bus lines are directly adjacent to one another in the first bus.

9. The integrated circuit of claim 8, wherein at least three of the respective dedicated bus lines are directly adjacent to one another in the first bus.

10. The integrated circuit of claim 8, wherein each valid codeword of the error-detection code causes a first of the at least two of the respective dedicated bus lines and a second of the at least two of said respective dedicated bus lines to carry different logic values.

11. The integrated circuit of claim 8, further comprising a second bus coupled between the controller and the encoder for carrying the subset of the control signals, wherein the first bus has a greater length than the second bus.

12. The integrated circuit of claim 11, further comprising a third bus coupled between the decoder and the subset of the control registers, wherein the first bus has a greater length than the third bus.

13. The integrated circuit of claim 8, further comprising a second bus coupled between the decoder and the subset of the control registers, wherein the first bus has a greater length than the second bus.

14. The integrated circuit of claim 1, wherein the subset of the control signals includes an erase-enable control signal and a program-enable control signal.

15. The integrated circuit of claim 14, wherein the subset of the control signals further includes an X-address-enable control signal, wherein an X-address identifies a respective word line in the array of memory cells.

16. The integrated circuit of claim 1, wherein:
the error-detection code causes the codeword to have two or more parity bits; and
for each valid codeword of the error-detection code, at least two of the two or more parity bits have different logic values.

17. The integrated circuit of claim 1, wherein the array of memory cells comprises a plurality of split-gate flash memory cells.

18. The integrated circuit of claim 1, wherein the controller further applies another subset of the control signals to another subset of the control registers.

19. The integrated circuit of claim 18, wherein the subset of the control signals and said other subset of the control signals have no control signals in common.

* * * * *